United States Patent [19]

Bartky et al.

[11] Patent Number: 5,003,679

[45] Date of Patent: Apr. 2, 1991

[54] METHOD OF MANUFACTURING A DROPLET DEPOSITION APPARATUS

[75] Inventors: W. Scott Bartky, Chicago, Ill.; Anthony D. Paton; Stephen Temple, both of Cambridge, England; A. John Michaelis, Glen Ellyn, Ill.

[73] Assignee: XAAR Limited, Cambridge, United Kingdom

[21] Appl. No.: 401,900

[22] Filed: Sep. 1, 1989

Related U.S. Application Data

[62] Division of Ser. No. 140,764, Jan. 4, 1988, Pat. No. 4,879,568.

[30] Foreign Application Priority Data

Jan. 10, 1987 [GB] United Kingdom ................. 8700531
Jan. 10, 1987 [GB] United Kingdom ................. 8700533

[51] Int. Cl.[5] ............................................ H01L 41/22

[52] U.S. Cl. .................................... 29/25.35; 310/333; 400/126

[58] Field of Search .......................... 29/25.35, 592 E; 310/333; 346/140 R; 400/126

[56] References Cited

U.S. PATENT DOCUMENTS 4,536,097 8/1985 Nilsson ................................ 400/126

*Primary Examiner*—Carl E. Hall

[57] ABSTRACT

A pulsed droplet ink jet printer has at least one channel communicating with a nozzle. The side wall of the channel is formed as a shear mode piezo-electric actuator. Electrodes applied to the actuator enable an electric field to be applied such that the actuator moves in the direction of the field to change the liquid pressure in the channel and thereby eject a droplet through the nozzle. The actuator can be made in two parts so as to deform, in cross section, to a chevron formation.

12 Claims, 6 Drawing Sheets

METHOD OF MANUFACTURING A DROPLET DEPOSITION APPARATUS

This application is a division of application Ser. No. 07/140,764, filed 01/04/88, now U.S. Pat. No. 4,879,568.

BACKGROUND OF THE INVENTION

This invention relates to pulsed droplet deposition apparatus. Typical of this kind of apparatus are pulsed droplet ink jet printers, often also referred to as "drop-on-demand" ink jet printers. Such printers are known, for example, for U.S. Pat. Nos. 3,946,398 (Kyser & Sears), 3,683,212 (Zoltan) and 3,747,120 (Stemme). In these specifications an ink or other liquid channel is connected to an ink ejection nozzle and a reservoir of the liquid employed. A piezo-electric actuator forms part of the channel and is displaceable in response to a voltage pulse and consequently generates a pulse in the liquid in the channel due to change of pressure therein which causes ejection of a liquid droplet from the channel.

The configuration of piezo-electric actuator employed by Kyser and Sears and Stemme is a diaphragm in flexure whilst that of Zoltan takes the form of a tubular cylindrically poled piezo-electric actuator. A flexural actuator operates by doing significant internal work during flexure and is accordingly not efficient. It is also not ideally suitable for mass production because fragile, thin layers of piezo-electric material have to be cut, cemented as a bimorph and mounted in the liquid channel. The cylindrical configuration also generates internal stresses, since it is in the form of a thick cylinder and the total work done per ejected droplet is substantial because the amount of piezo-electric material employed is considerable. The output impedance of a cylindrical actuator also proves not to be well matched to the output impedance presented by the liquid and the nozzle aperture. Both types of actuator, further, do not readily lend themselves to production of high resolution droplet deposition apparatus in which the droplet deposition head is formed with a multi-channel array, that is to say a droplet deposition head with a multiplicity of liquid channels communicating with respective nozzles.

Another form of pulsed droplet deposition apparatus is known from U.S. Pat. No. 4,584,590 (Fishbeck & Wright). This specification discloses an array of pulsed droplet deposition devices operating in shear mode in which a series of electrodes provided on a sheet of piezo-electric material divides the sheet into discrete deformable sections extending between the electrodes. The sheet is poled in a direction normal thereto and deflection of the sections takes place in the direction of poling. Such an array is difficult to make by mass-production techniques. Nor does it enable a particularly high density array of liquid channels to be achieved as is required in apparatus where droplets are to be deposited at high density, as for example, in high quality pulsed droplet, ink jet printers.

SUMMARY OF THE INVENTION

It is accordingly one object of the present invention to provide single or multi-channel pulsed droplet deposition apparatus in which the piezo-electric actuator means are of improved efficiency and are better matched in the channel—or as the case may be, each channel to the output impedance of the liquid and nozzle aperture. Another object is to provide a pulsed droplet deposition apparatus with piezo-electric actuator means which readily lends itself to mass production. A still further object is to provide a pulsed droplet deposition apparatus which can be manufactured, more easily than the known constructions referred to, in high density multi-channel array form. Yet a further object is to provide a pulsed droplet deposition apparatus in multi-channel array form in which a higher density of channels, e.g. two or more channels per millimetre, can be achieved than in the known constructions referred to.

The present invention consists in a pulsed droplet deposition apparatus comprising a liquid droplet ejection nozzle, a pressure chamber with which said nozzle communicates and from which said nozzle is supplied with liquid for droplet ejection, a shear mode actuator comprising piezo-electric material and electrode means for applying an electric field thereto, and liquid supply means for replenishing in said chamber liquid expelled from said nozzle by operation of said actuator, characterised in that said actuator is disposed so as to be able under an electric field applied between said electrode means to move in relation to said chamber in shear mode in the direction of said field to change the liquid pressure in said chamber and thereby cause droplet ejection from said nozzle.

In another embodiment, the invention consists in a liquid droplet ejection nozzle, a pressure chamber with which said nozzle communicates and from which said nozzle is supplied with liquid for droplet ejection, a shear mode actuator comprising piezo-electric material and electrode means for applying an electric field thereto, and liquid supply means for replenishing in said chamber liquid expelled from said nozzle by operation of said actuator, characterised in that said actuator comprises crystalline material orientated for shear mode displacement, under an electric field applied by way of said electrode means, transversely to said field and is disposed so as to be able to move in relation to said chamber under said applied field to change the pressure in the chamber and thereby cause drop ejection from said nozzle.

There is for many applications a need to produce multi-channel array pulsed droplet deposition apparatus. The attraction of using piezo-electric actuators for such apparatus is their simplicity and their comparative energy efficiency. Efficiency requires that the output impedance of the actuators is matched to that of the liquid in the associated channels and the corresponding nozzle apertures. An associated requirement of multi-channel arrays is that the electronic drive voltage and current match available, low cost, large scale integrated silicon chip specifications. Also, it is advantageous to construct drop deposition heads having a high linear density, i.e. a high density of liquid channels per uint length of the line of droplet which the head is capable of depositing, so that the specified deposited droplet density is obtained with at most one or two lines of nozzle apertures. A further requirement is that multi-channel array droplet deposition heads shall be capable of mass production by converting a single piezo-electric part into several hundred or thousand individual channels in a parallel production process stage.

It has already been mentioned that the energy efficiency of a cylindrical actuator is not sufficiently good. Mass production of apparatus employing flexural actuators in arrays of sufficiently high density is not feasible. Also, sufficiently high density arrays are not achievable in known shear mode operated systems. The further requirements referred to of multi-channel droplet deposition heads are also not satisfactorily met by flexural or cylindrical forms of actuator. It is accordingly a further object of the invention to provide an improved multi-channel array pulsed droplet deposition apparatus and method of making the same in which the requirements referred to are better accomplished than in known constructions.

Accordingly, the present invention further consists in a multi-channel array, pulsed drople deposition apparatus, comprising opposed top and base walls and shear mode actuator walls of piezo-electric material extending between said top and base walls and arranged in pairs of successive actuator walls to define a plurality of separated liquid channels between the walls of each of said pairs, a nozzle means providing nozzles respectively communicating with said channels, liquid supply means for supplying liquid to said channels for replenishment of droplets ejected from said channels and field elecrode means provided on said actuator walls for forming respective actuating fields therein, said actuator walls being so disposed in relation to the direction of said actuating fields as to be laterally deflected by said respective actuating fields to cause change of pressure in the liquid in said channels to effect droplet ejection therefrom.

The invention further consists in a method of making a multi-channel array pulsed droplet deposition apparatus, comprising the steps of forming a base wall with a layer of piezo-electric material, forming a multiplicity of parallel grooves in said base wall which extend through said layer of piezo-electric material to afford walls of piezo-electric material between successive grooves, pairs of opposing walls defining between them respective liquid channels, locating electrodes in relation to said walls so that an electric field can be applied to effect shear mode displacement of said walls transversely to said channels, connecting electrical drive circuit means to said electrodes, securing a top wall to said walls to close said liquid channels, and providing nozzles and liquid supply means for said liquid channels.

BRIEF DESCRIPTION OF THE DRAWINGS

The invention will now be described, by way of example, with reference to the accompanying diagrammatic drawings, in which:

FIG. 1(*b*) is a cross-sectional elevation of the printhead of FIG. 1(*a*) taken on the line A—A of that figure;

FIG. 1(*c*) is a view similar to FIG. 1(*b*) showing the printhead in the condition where a voltage impulse is applied to the ink channel thereof;

FIG. 6(*b*) illustrates how field electrodes may be employed with the material of FIG. 6(*a*);

FIG. 9(*b*) is a sectional plan view on the line B—B of FIG. 9(*a*);

FIG. 10(*b*) is a view showing one arrangement of electrode connections employed in the array printhead of FIG. 10(*a*)

DESCRIPTION OF THE PREFERRED EMBODIMENTS

Figure 1A:
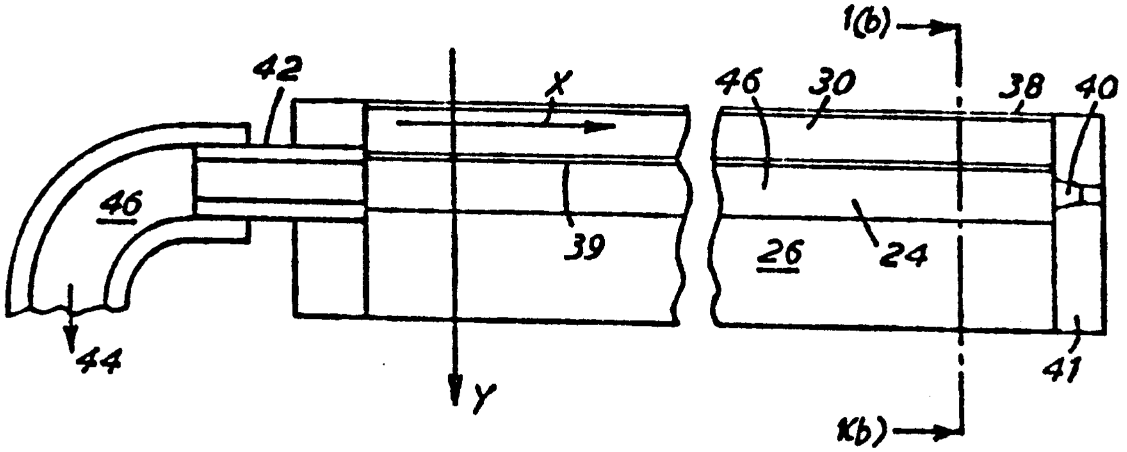
FIG. 1(*a*) is a sectional plan view of one embodiment of single channel pulsed droplet deposition apparatus in the form of a single channel pulsed ink droplet printhead.

In the Figures, like parts are accorded the same reference numerals.

Figure 1B:
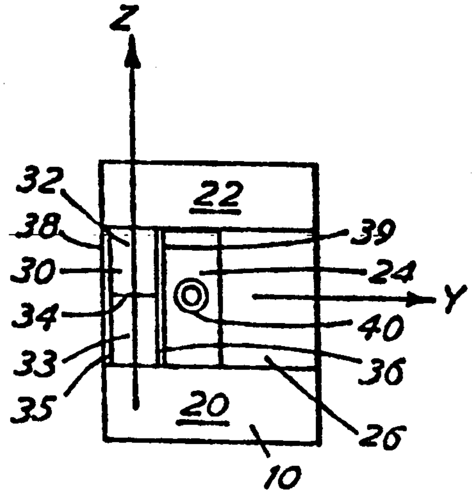
Figure 1C:
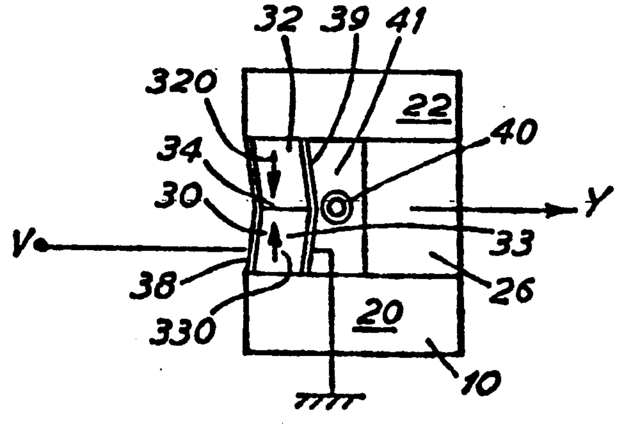

Referring first to FIGS. 1(*a*), 1(*b*) and 1(*c*), a single channel pulsed ink droplet printhead 10 consists of a base wall 20 and a top or cover wall 22 between which a single ink channel 24 is formed employing a sandwich construction. The channel is closed by a rigid wall 26 on one side and a shear mode wall actuator 30 on the other. Each of the walls 26 and 30 and the base and cover walls 20 and 22 extend the full length of the channel 24.

The shear-mode actuator consists of a wall 30 of piezo-electric ceramic material, suitably, lead zirconium titanate (PZT), pole in the direction of the axis Z, see FIG. 1(*b*). The wall 30 is constructed in upper and lower parts 32 and 33 which are respectively poled in opposite senses as indicated by the arrows 320 and 330 in FIG. 1(*c*). The parts 32 and 33 are bonded together at their common surface 34 and are rigidly cemented to the cover and base. The parts 32 and 33 can alternatively be parts of a monolithic wall of piezo-electric material, as will be discussed. The faces 35 and 36 of the actuator wall are metallised to afford metal electrodes 38, 39 covering substantially the whole height and length of the actuator wall faces 35 and 36.

The channel 24 formed in this way is closed at one end by a nozzle plate 41 in which nozzle 40 is formed and at the other end an ink supply tube 42 is connected to an ink reservoir 44 (not shown) by a tube 46. Typically, the diminsions of the channel 24 are 20–200 μm by 100–1000 μm in section and 10–40 mm in length, so that the channel has a long aspect ratio. The actuator wall forms one of the longer sides of the rectangular cross-section of the channel.

The wall parts 32 and 33 each behave when subjected to voltage V as a stack of laminae which are parallel to the base wall 20 and top or cover wall 22 and which are rotated in shear mode about an axis at the fixed edge thereof, the cover wall in the case of wall part 32 and the base wall in the case of wall part 33, which extends lengthwise with respect to the wall 30. This produces the effect that the laminae move transversely increasingly as their distance from the fixed edge of the stack increases. The wall parts 32 and 33 thus deflect to a chevron disposition as depicted in FIG. 1(*c*).

The single channel printhead 10 described is capable of emitting ink droplets responsively to applying differential voltage pulses V to the shear mode actuator electrodes 38, 39. Each such pulse sets up an electric field in the direction of the Y axis in the two parts of the actuator wall, normal to the poled Z axis. This develops shear distortion in the piezo-electric ceramic and causes the actuator wall 30 to deflect in the Y axis direction as illustrated in FIG. 1(*c*) into the ink jet channel 24. This displacement establishes a pressure in the ink the length of the channel. Typically a pressure of 30–300 kPa is applied to operate the printhead and this can be obtained with only a small mean deflection normal to the actuator wall since the channel dimension normal to the wall is also small.

Dissipation of the pressure developed in this way in the ink, provided the pressure exceeds a minimum value, causes a droplet of ink to be expelled from the nozzle 40. This occurs by reason of an acoustic pressure step wave which travels the length of the channel to dissipate the energy stored in the ink and actuator. The volume strain or condensation as the pressure wave recedes from the nozzle develops a flow of ink from the nozzle outlet aperture for a period L/a, where a is the effective acoustic velocity of ink in the channel which is of length L. A droplet of ink is expelled during this period. After time L/a the pressure becomes negative, ink emission ceases and the applied voltage can be removed. Subsequently, as the pressure wave is damped, ink ejected from the channel is replenished from the ink supply and the droplet expulsion cycle can be repeated.

A shear mode actuator of the type illustrated is found to work most efficiently in terms of the pressure generated in the ink and volume of ink droplet expelled when a careful choice of optimum dimensions of the actuator and channel is made. Improved design may also be obtained by stiffening the actuator wall with layers of a material whose modulus of elasticity on the faces of the actuator exceeds that of the ceramic: for example, if the metal electrodes are deposited with thickness greater than is required merely to function as electrodes and are formed of a metal whose elastic modulus exceeds that of the piezo-electric ceramic, the wall has substantially increased flexural rigidity without significantly increasing its shear rigidity. Nickel or rhodium are materials suitable for this purpose. The actuator is then found to have increased rigidity. The wall and ink thickness can then be reduced and a more compact printhead thus made. The same effect is accomplished by applying a passivation coating to the wall surfaces, such as aluminium oxide ($Al_2O_3$) or silicon nitride ($Si_3N_4$) over the metal electrodes of the actuator whose thickness exceeds that required for insulation alone, since these materials are also more rigid than the piezo-electric ceramic. Other means of stiffening the actuator wall are discussed hereinafter and one such means in particular with reference to FIG. 7.

A shear mode actuator such as that described possesses a number of advantages over flexural and cylindrical types of actuator. Piezo-electric ceramic used in the shear mode does not couple other modes of piezo-electric distortion. Energisation of the actuator illustrated therefore causes deformation into the channel efficiently without dissipating energy into the surrounding printhead structure. Such flexure of the actuator as occurs retains stored energy compliantly coupled with the energy stored in the ink and contributes to the energy available for droplet ejection. The benefit obtained from rigid metal electrodes reinforces this advantage of this form of actuator. When the actuator is provided in an ink channel of long aspect ratio which operates using an acoustic travelling pressure wave, the actuator compliance is closely coupled with the compliance of the ink and very small actuator deflections (5–200 nm) generate a volume displacement sufficient to displace an ink droplet. For these reasons a shear mode actuator proves to be very efficient in terms of material usage and energy, is flexible in design and capable of integration with low voltage electronic drive circuits.

Single channel shear mode actuators can be constructed in several different forms, examples of which are illustrated in FIGS. 2 to 7. Each of the actuators illustrated in FIGS. 2 to 5 and 7 is characterised in that it is formed from poled material and the poled axis Z of the actuator lies parallel to the actuator wall surfaces extending between the base wall 20 and cover wall 22 and the actuating electric field is normal to the poled axis Z and the axis of the channel. Deflection of the actuator is along the field axis Y. In each case also the actuator forms one wall of a long aspect ratio acoustic channel, so that actuation is accomplished by a small displacement of the wall acting over a substantial area of the channel side surface. Droplet expulsion is the consequence of pressure dissipation via an acoustic travelling wave.

Figure 2A:
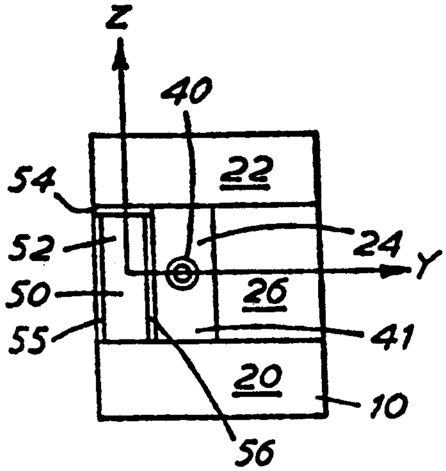
FIGS. 2(*a*) and 2(*b*) are cross-sectional elevations of a second embodiment of the printhead of the previous figures, FIG. 2(*a*) showing the printhead before, and FIG. 2(*b*) showing the printhead at the instant of application of an impulse to the ink channel thereof.
Figure 2B:
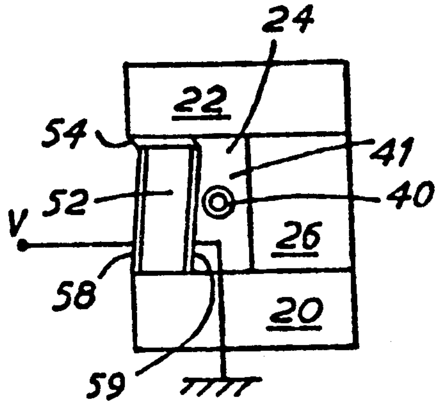

The shear mode actuator in FIGS. 2(*a*) and 2(*b*) is termed a strip seal actuator. The illustration shows the corresponding printhead 10 including the base wall 20, cover wall 22 and rigid side wall 26. The shear mode wall actuator enclosing the ink jet channel 24 is in this instance a cantilever actuator 50 having a compliant strip seal 54. This is built using a single piece of piezo-electric ceramic 52 poled in the direction of the axis Z and extending the length of the ink jet channel. The faces 55, 56 of the ceramic extending between the base and cover are metallised with metal electrodes 58, 59 covering substantially the whole areas thereof. The ceramic is rigidly bonded at one edge to the base 20 and is joined to the cover 22 by the compliant sealing strip 54 which is bonded to the actuator 50 and the cover 22. The channel as previously described is closed at one of its respective ends by a nozzle plate 41 formed with a nozzle 40 and, at the other end, tube 42 connects the channel with ink reservoir 44.

In the case of FIGS. 2(*a*) and 2(*b*), actuation by applying an electric field develops shear mode distortion in the actuator, which deflects in cantilever mode and develops pressure in the ink in the channel. The performance of the actuator has the best characteristics when careful choice is made of the dimensions of the actuator and channel, the dimensions and compliance of the metal electrodes 58, 59 being also preferably optimised. The deflection of the actuator is illustrated in FIG. 2(*b*).

Figure 3A:
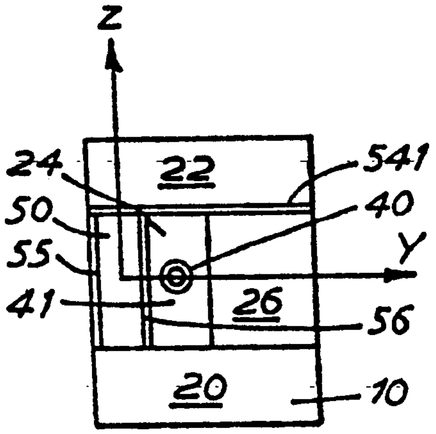
FIGS. 3(*a*) and 3(*b*) and FIGS. 4(*a*) and 4(*b*) are cross-sectional elevations similar to FIGS. 2(*a*) and 2(*b*) of respective third and fourth embodiments of the printhead of the earlier figures.
Figure 3B:
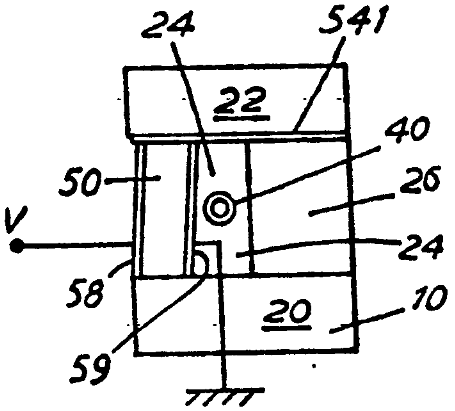

An alternative design of shear mode actuator is illustrated in FIGS. 3(*a*) and 3(*b*), in which case a compliant seal strip 541 is continuous across the surface of the cover 22 adjoining the fixed wall 26 and the actuator 50. A seal strip of this type has advantages in construction but is found to perform less effectively after optimisation of the parameters is carried out than the preceding designs.

Figure 4A:
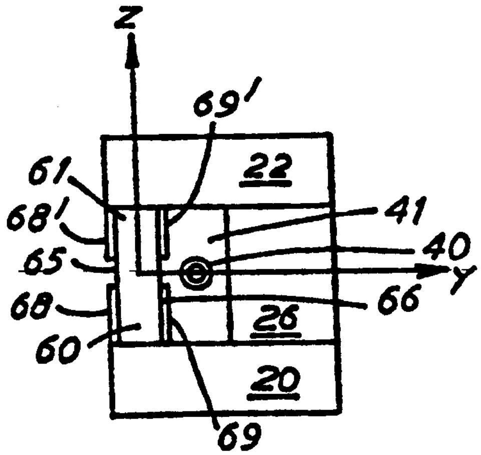
Figure 4B:
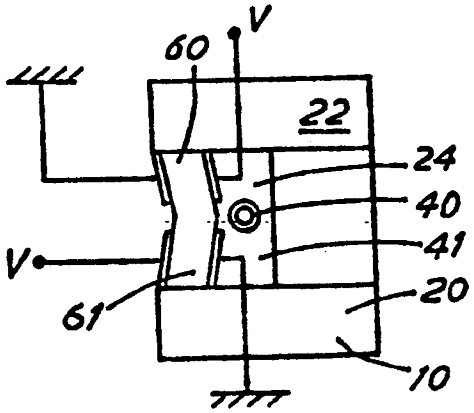

Referring now to FIGS. 4(*a*) and 4(*b*) a shear mode wall actuator 60 comprises a single piece of piezo-electric ceramic 61 poled in the direction of the axis Z normal to the top and base walls. The ceramic piece is bonded rigidly to the base and top walls. The faces 65 and 66 are metallised with metal electrodes 68, 69 in their lower half and electrodes 68' and 69' in their upper half, connections to the electrodes being arranged to apply field voltage V in opposite senses in the upper and lower halves of the ceramic piece. A sufficient gap is maintained between the electrodes 68 and 68', 69 and 69' to ensure that the electric fields in the ceramic are each below the material voltage breakdown. Although in this embodiment the shear mode wall actuator is constructed from a single piece of ceramic, because of its electrode configuration which provides opposite fields in the upper and lower half thereof it has a shear mode deflection closely similar to that of the two part actuator in FIGS. 1(*a*) and 1(*b*).

Figure 5A:
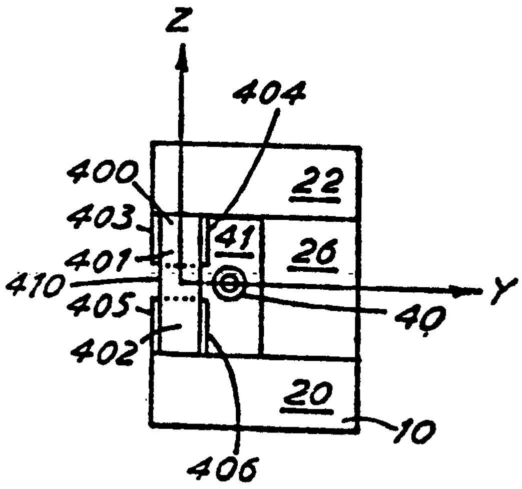
FIGS. 5(*a*) and 5(*b*) illustrate a modification applicable to the embodiments of FIGS. 1(*a*), 1(*b*) and 1(*c*) and FIGS. 4(*a*) and 4(*b*)
Figure 5B:
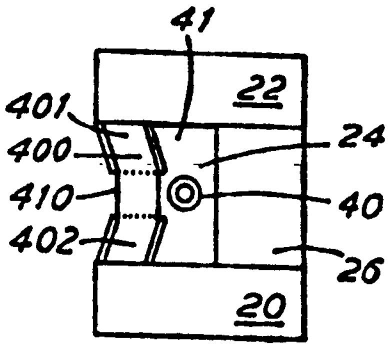

Referring now to FIGS. 5(*a*) and 5(*b*), an actuator wall 400 has upper and lower active parts 401, 402 poled in the direction of the Z axis and an inactive part 410 therebetween. Electrodes 403, 404 are disposed on opposite sides of wall part 401 and electrodes 405 and 406 are disposed on opposite sides of wall part 402. If the wall parts 401 and 402 are poled in opposite senses, a voltage V is applied through connections (not shown) in the same sense along the Y axis to the electrode pairs 403, 404 and 405, 406 but if the wall parts 401, 402 are poled in the same sense the voltage V is applied in opposite senses to the electrode pairs 403, 404 and 405, 406. In either case the deflection of the wall actuator is as shown in FIG. 5(*b*).

In the case of the embodiments described, with the exception of that form of FIG. 1(*b*) where the actuator wall parts are joined at the surface 34, the base wall 20, side wall 26 and actuator wall facing wall 26 can be made from material of rectangular cross-section comprising a single piece of piezo-electric ceramic material or a laminate including one or more layers of piezo-eletric ceramic material and cutting a groove of rectangular cross-section through the piezo-electric material to form channel 24 side wall 26 and the facing actuator wall which is then or previously has been electrically poled in known manner as required. Cover or top wall 22 is then secured directly or by a sealing strip as dictated by the embodiment concerned to the uppermost surfaces of the side walls to close the top side of the channel 24. Thereafter, nozzle plate 41 in which nozzle 40 is formed is rigidly secured to one end of the channel.

Figure 6A:
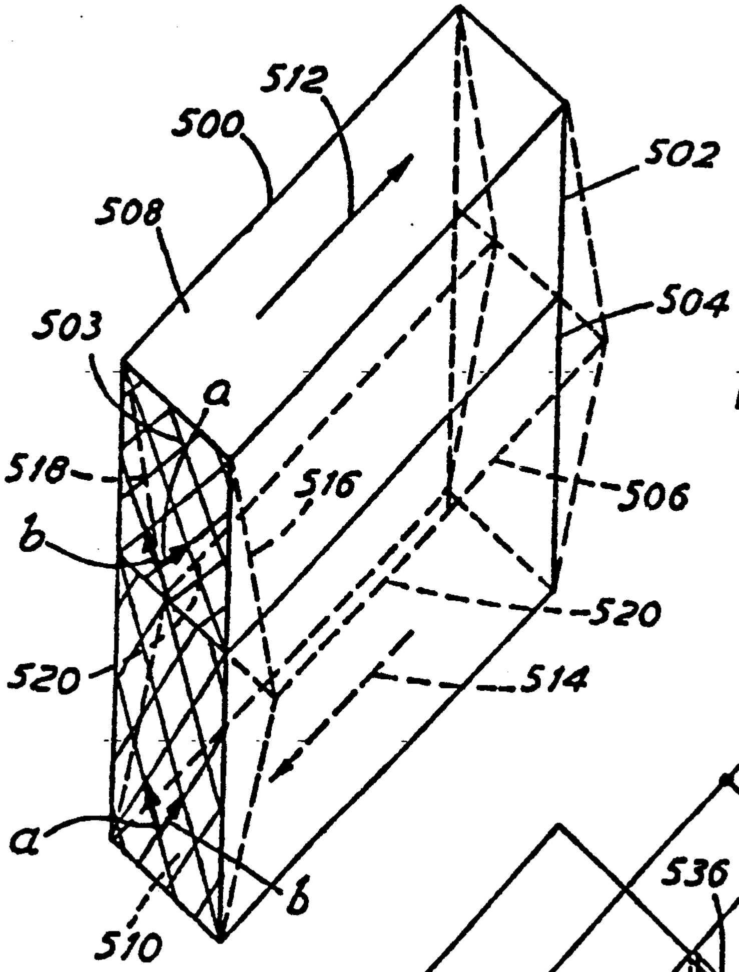
FIG. 6(*a*) is a perspective view illustrating the behaviour of a different type of piezo-electric material from that employed in the embodiments of the earlier figures.
Figure 6B:
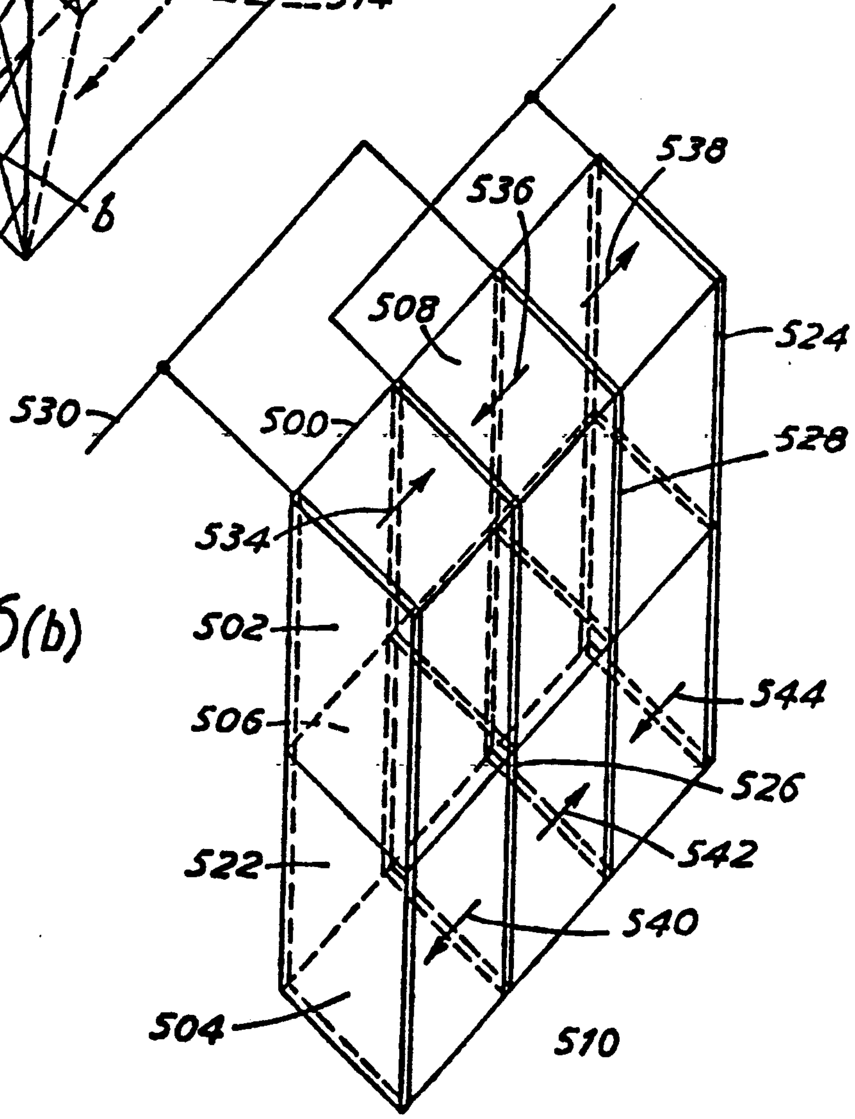

As an alternative to piezo-electric ceramic, certain crystalline materials such as gadolinium molybdate (GMO) or Rochelle salt can be employed in the realisation of the above described embodiments. These are unpoled materials which provided they are cut to afford a specific crystalline orientation, will deflect in shear mode normal to the direction of an applied field. This behaviour is illustrated in FIG. 6(*a*) which shows a wall 500 of GMO having upper and lower wall parts 502, 504 disposed one above the other and secured together at a common face 506. The wall parts are cut in the plane of the 'a' and 'b' axes and so that the 'a' and 'b' axes in the upper wall part are normal to those axes in the lower wall part. When upper face 508 of wall part 502 and lower face 510 of wall part 504 are held fixed and electric fields indicated by arrows 512 and 514 (which can be oppositely directed or directed in the same sense) are applied respectively to the wall parts 502 and 504, lateral shear mode deflection occurs. As shown in broken lines 516, 518, 520 this deflection is a maximum on the common face 506 and tapers to zero at the faces 508 and 510. It will be apparent that as with the embodiment of FIGS. 5(*a*) and 5(*b*) the wall parts 502 and 504 may be provided therebetween with an inactive wall part. This arrangement is appropriate with GMO whose activity is typically 100 times that of PZT.

The preferred electrode arrangement is shown in FIG. 6(*b*) where electrodes 522 and 524 are provided at opposite ends of the wall 500 and electrodes 526 and 528 are provided at intermediate equally spaced locations along the wall. The electrodes 522 and 528 are connected together to terminal 530 as are the electrodes 524 and 526 to terminal 532. A voltage is applied between said terminals resulting in electric fields 534 and 540 in the wall parts between the electrodes 522 and 526, electric fields 536 and 542 in the wall parts between the electrodes 526 and 528, and electric fields 538 and 544 between the electrodes 528 and 524, all the fields being directed as shown by the arrows. Rochelle salt behaves generally in a similar manner to GMO.

Figure 7:
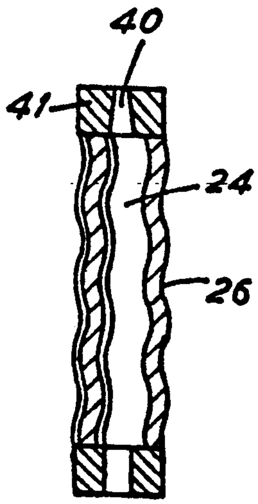
FIG. 7 is a sectional plan view of a modification applicable to the embodiments of the invention illustrated in the previous figures of drawings.
Figure 9A:
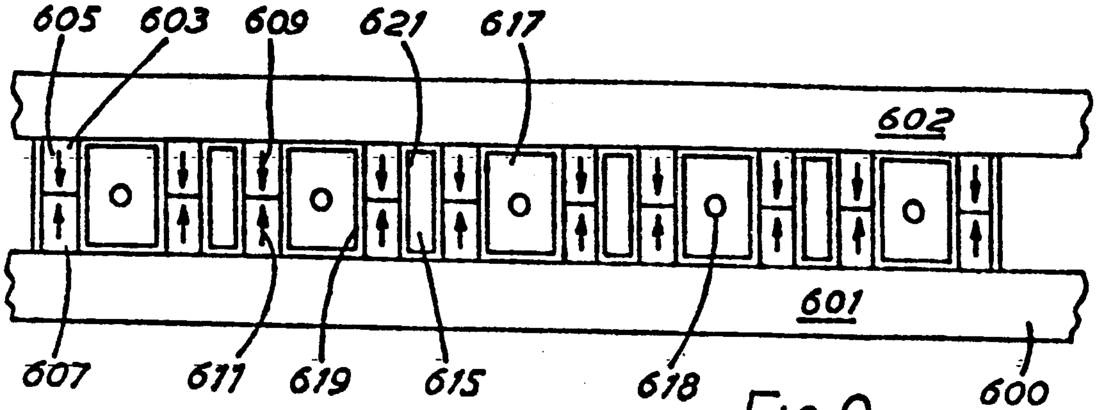
FIG. 9(*a*) is a sectional end elevation of a pulsed droplet deposition apparatus in the form of a multi-channel array pulsed ink jet printhead.
Figure 9B:
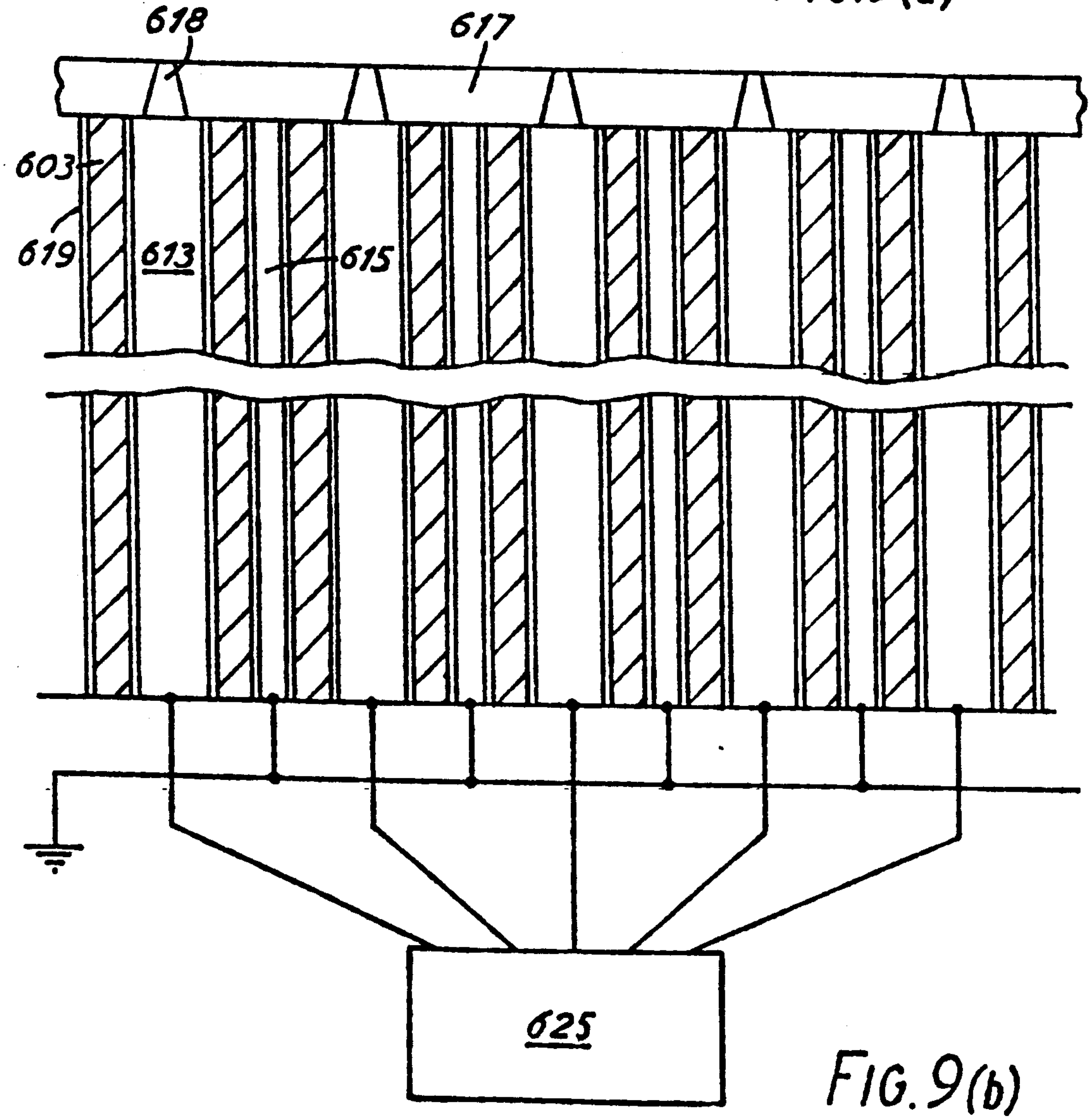

In the modification illustrated in sectional plan view in FIG. 7, which is applicable to all the previously described embodiments of the invention as well as to those depicted in FIGS. 9(*a*) and 9(*b*) and 10(*a*) and 10(*b*), the rigid wall 26 and the opposite actuator wall (30,50,60 and 400 of the embodiments illustrated in the previous drawings) with its electrodes are of sinuous form in plan view to afford stiffening thereof as an alternative to using thickened or coated electrodes as previously described.

An alternative way of stiffening the actuator walls is to taper the walls where they are single part active walls and to taper each active part where the walls each have two active parts from the root to the tip of each active part. By "root" is meant the fixed location of the wall or wall part. The tapering is desirably such that the tip is 80 per cent or more of the thickness of the root. With such a configuration, the field across the tip of the actuator wall or wall part is stronger than the field across the root so that greater shear deflection occurs at the tip than at the root. Also, the wall or wall part is stiffer because it is thicker where it is subject to the highest bending moment, in the root.

Figure 8:
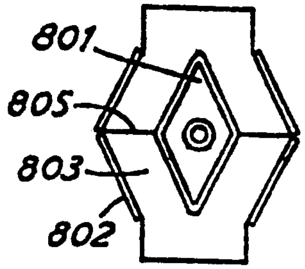
FIG. 8 is a cross-section of a modified printhead according to this invention.

It will be appreciated that other forms of single channel printheads apart from those so far described, can be made within the ambit of the invention. Referring for example to FIG. 8, a channel 29 is made by cutting or otherwise forming generally triangular section grooves 801 in respective facing surfaces of two similar pieces of material 803 which may comprise piezo-electric ceramic material or may each include a layer of such material in which the generally triangular groove is formed. The facing surfaces 805 of said pieces of material are secured together to form the channel after the outer and inner facing field electrodes 802 and 807 are applied as shown. The actuator thus formed is of the two part wall form shown in FIGS. 1(*a*) and 1(*b*) but with the actuator wall parts forming two adjacent side walls of the channel.

Referring now to FIGS. 9(*a*) and 9(*b*), a pulsed droplet ink jet printhead 600 comprises a base wall 601 and a top wall 602 between which extend shear mode actuator walls 603 having oppositely poled upper and lower wall parts 605, 607 as shown by arrows 609 and 611, the poling direction being normal to the top and base walls. The walls 603 are arranged in pairs to define channels 613 therebetween and between successive pairs of the walls 603 which define the channels 613 are spaces 615 which are narrower than the channels 613. At one end of the channels 613 is secured a nozzle plate 617 formed with nozzles 618 for the respective channels and at opposite sides of each actuator wall 603 are electrodes 619 and 621 in the form of metallised layers applied to the actuator wall surfaces. The electrodes are passivated with an insulating material (not shown) and the electrodes which are disposed in the spaces 615 are connected to a common earth 623 whilst the electrodes in the channels 613 are connected to a silicon chip 625 which provides the actuator drive circuits. As already described in connection with FIGS. 1 to 5 the wall surfaces of the actuator walls carrying the electrodes may be stiffened by thickening or coating of the electrodes or, as described in relation to FIG. 7, by making the walls of sinuous form. A sealing strip may be provided as previously described extending over the surface of the top wall 602 facing the actuator walls 603.

In operation, a voltage applied to the electrodes in each channel causes the walls facing the channel to be displaced into the channel and generate pressure in the ink in the channel. Pressure dissipation causes ejection of a droplet from the channel in a period L/a where L is the channel length and a is the velocity of the acoustic pressure wave. The voltage pulse applied to the electrodes of the channel is held for the period L/a for the condensation of the acoustic wave to be completed. The droplet size can be made smaller by terminating the voltage pulse before the end of the period L/a or by varying the amplitude of the voltage. This is useful in tone and colour printing.

The printhead 600 is manufactured by first laminating pre-poled layers of piezo-electric ceramic to base and top walls 601 and 602, the thickness of these layers equating to the height of the wall parts 605 and 607. Parallel grooves are next formed by cutting with parallel, diamond dust impregnated, disks mounted on a common shaft or by laser cutting at the spacings dictated by the width of the channels 613 and spaces 615. Depending on the linear density of the channels this may be accomplished in one or more passes of the disks. The electrodes are next deposited suitably, by vacuum deposition, on the surfaces of the poled wall parts and then passivated by applying a layer of insulation thereto and the wall parts 605,607 are cemented together to form the channels 613 and spaces 615. Next the nozzle plate 617 in which the nozzles have been formed is bonded to the part defining the channels and spaces at common ends thereof after which, at the ends of the spaces and channels remote from the nozzle plate 617, the connections to the common earth 623 and chip 625 are applied.

The construction described enables pulsed ink droplet array printheads to be made with channels at linear densities of 2 or more per mm so that much higher densities are achievable by this mode of construction than has hitherto been possible with array printheads. Printheads can be disposed side by side to extend the line of print to desired length and closely spaced parallel lines of printheads directed towards a printline or corresponding printlines enable high density printing to be achieved. Each channel is independently actuated and has two active walls per channel although it is possible to depole walls at corresponding sides of each channel after cutting of the channel and intervening space grooves.

This would normally be done by heating above the Curie temperature by laser or by suitable masking to leave exposed the walls to be depoled and then subjecting those walls to radiant heat to raise them above the Curie temperature.

Figure 10A:
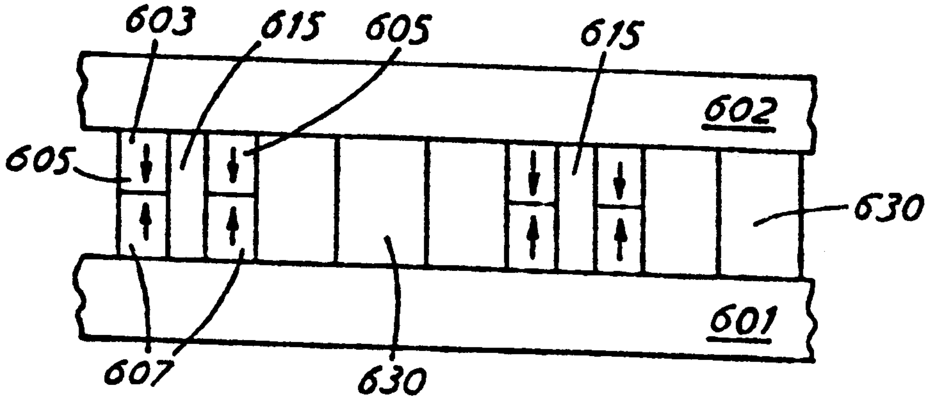
FIG. 10(*a*) is a view similar to FIG. 9(*a*) of a modification of the array printhead of that Figure.
Figure 10B:
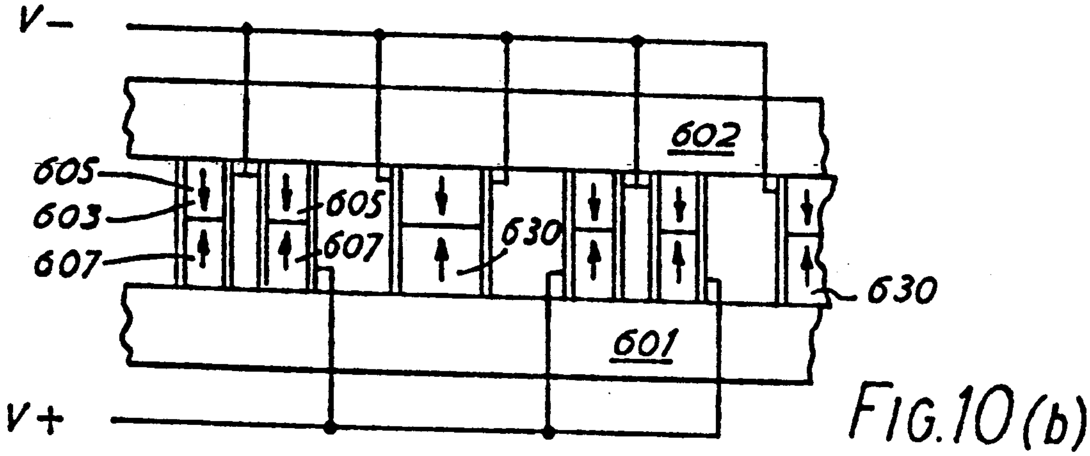

In another construction, illustrated in FIGS. 10(*a*) and 10(*b*), inactive walls 630 can be formed which divide each liquid channel 613 longitudinally into two such channels having side walls defined respectively by one of the active walls 603 and one of the inactive walls 630. The walls 630 may be rendered inactive by depoling as described or by an electrode arrangement as shown in FIG. 10(*b*) in which it will be seen that electrodes on opposite sides of the walls 630 which are poled are held at the same potential so that the walls 630 are not activated whilst the electrodes at opposite sides of the active walls apply an electric field thereto to effect shear mode deflection thereof.

The construction of FIGS. 10(*a*) and 10(*b*) is less active than that of FIGS. 9(*a*) and 9(*b*) and therefore needs higher voltage and energy for its operation.

Shear mode actuation does not generate in the channels significant longitudinal stress and strains which give rise to cross-talk. Also, as poling is normal to the sheet of piezo-electric material laminated to the base and top or cover walls, the piezo-electric material is conveniently provided in sheet form.

It will be apparent to those skilled in the art that the construction of the embodiment described with reference to FIGS. 9(*a*) and 9(*b*) and 10(*a*) and 10(*b*) can be achieved by methods modified somewhat from those described. For example, the oppositely poled layers could be cemented together and to the base or cover wall and the channel and space grooves 613 and 615 formed thereafter by cutting with disks or by laser. The electrodes and their insulating layers would thereafter be applied prior to securing the nozzle plate 617 and making the earth and silicon chip connections.

In a further modification of the structure and method of construction of the pulsed droplet ink jet array printhead described with reference to FIGS. 9(*a*) and 9(*b*) a single sheet of piezo-electric material is poled perpendicularly to opposite top and bottom surfaces of the sheet the poling being in respective opposite senses adjacent said top and bottom surfaces. Between the oppositely poled region there may be an inactive region. The sheet is laminated to a base layer and the cutting of the channels and intervening space grooves then follows and the succeeding process steps are as described for the modification in which oppositely poled layers are laminated to the base layer and grooves formed therein. Alternatively, the base and top walls may each have a sheet of poled piezo-electric material laminated thereto, the piezo-electric material being poled normal to the base of top wall to which it is secured. Laminated to each sheet of piezo-electric material is a further sheet of inactive material so that respective three layer assemblies are provided in which the grooves to form the shear mode actuator walls are cut or otherwise formed. Electrodes are then applied to the actuator walls as required and the assemblies are mutually secured with the grooves of one assembly in facing relationship with those of the other assembly thereby to form the ink channels and vacant spaces between said channels.

It will be understood that the multi-channel array embodiments of the invention can be realised with the ink channels thereof employing shear mode actuators of the forms described in connection with FIGS. 1 to 7 thereof.

Figure 11:
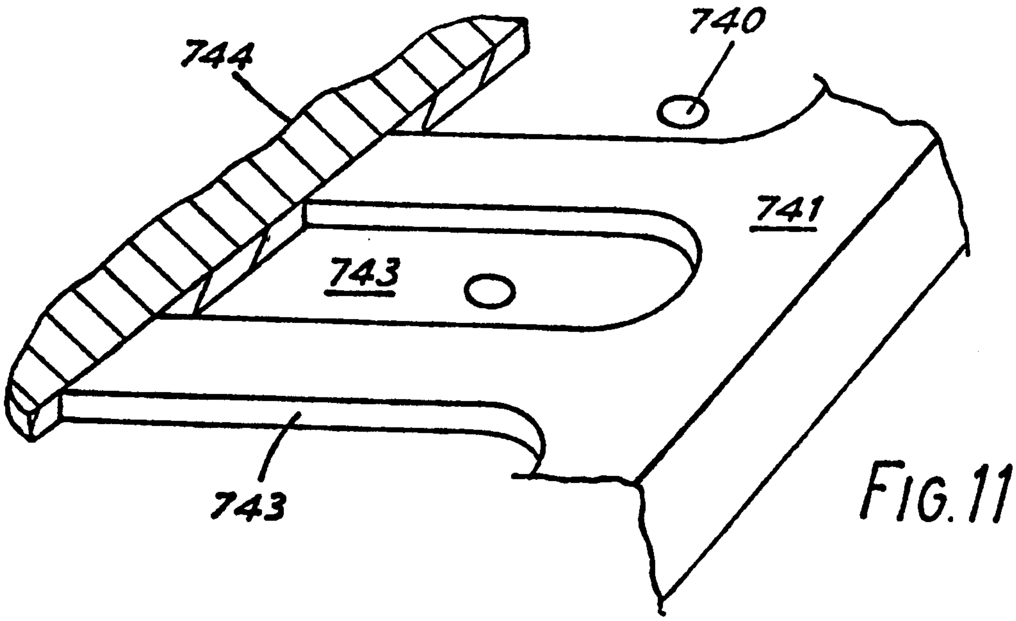
FIG. 11 is a partly diagrammatic perspective view illustrating a still further modification.

Although in the embodiments of the invention described above, the ink supply is connected to the end of the ink channel or ink channel array remote from the nozzle plate, the ink supply can be connected at some other point of the channel or channels intermediate the ends thereof. Furthermore, it is possible as shown in FIG. 11, to effect supply of ink by way of the nozzle or nozzles. The nozzle plate 741, includes a recess 743 around each nozzle 740, in the surface of the nozzle plate remote from the channels. Each such recess 743 has an edge opening to an ink reservoir shown diagrammatically at 744. The described acoustic wave causes, on actuation of a channel, an ink droplet to be ejected from the open ink surface immediately above the nozzle. Ink in the channel is then replenished from the recess 743, which is in turn replenished from the reservoir 744.

Although the described embodiments of the invention concern pulsed droplet ink jet printers, the invention also embraces other forms of pulsed droplet deposition apparatus, for example, such apparatus for depositing a coating without contact on a moving web and apparatus for depositing photo resist, sealant, etchant, dilutant, photo developer, dye etc. Further, it will be understood that the multi-channel array forms of the invention described may instead of piezo-electric ceramic materials employ piezo-electric crystalline substances such as GMO and Rochelle salt.

Reference is made to co-pending application Ser. No. 07/140,617, now U.S. Pat. No. 4,887,100, the disclosure of which is hereby incorporated herein by reference.

We claim:

1. The method of making a multi-channel array pulsed droplet deposition apparatus, comprising the steps of (a) forming a base wall with a layer of piezo-electric material (b) forming a multiplicity of parallel grooves in said base wall which extend through said layer of piezo-electric material to afford walls of piezo-electric material between successive grooves, pairs of opposing walls defining between them respective liquid channels (c) locating electrodes in relation to said walls so that an electric field can be applied to effect shear mode displacement of said walls transversely to said channels (d) connecting electrical drive circuit means to said electrodes (e) securing a top wall to said walls to close said liquid channels (f) providing nozzles and liquid supply means for said liquid channels.

2. The method claimed in claim 1, further comprising providing two layers of piezo-electric material on said base wall and forming said grooves so as to extend through both of said layers to provide said upright walls, with upper and lower parts of each of said upright walls adapted when said electrodes are disposed relatively thereto and subjected to electric fields to deflect in shear mode in the same direction transversely to said channels.

3. The method claimed in claim 1, further comprising providing a layer of piezo-electric material on each of said base and top walls, forming at corresponding spacings in each of said layers of piezo-electric material a multiplicity of parallel grooves to provide upstanding walls on said base wall and on said top wall and securing said top wall to said upright walls of the base wall by securing said upright walls formed on said top wall to corresponding upright walls of said upright walls formed on said base wall, the upright walls on the top wall and the upright walls on the base wall being adapted so that when an electric field is applied thereto at said electrodes the upright walls of said top and base walls deflect in the same direction transversely to said channels.

4. The method claimed in claim 2, further comprising providing an upright inactive wall between the walls of each of said pairs of walls between which said channels are disposed, thereby to divide each of said channels longitudinally into two channels.

5. The method claimed in claim 4, further comprising locating electrodes relatively to said active walls and maintaining, during operation, said electrodes at equal potentials to prevent shear mode displacement of said inactive walls.

6. The method claimed in claim 2, wherein said liquid supply means are provided at ends of the channels remote from said nozzles.

7. The method claimed in claim 2, wherein said liquid supply means are provided at respective ends of said channels adjacent said nozzles for replenishment through said nozzles of liquid in said channels expelled from said nozzles.

8. The method claimed in claims 2, wherein PZT is employed as said piezo-electric material.

9. The method claimed in claim 2, wherein a piezo-electric crystalline material such as GMO or Rochelle salt is employed as said piezo-electric material.

10. The method as claimed in claim 1, wherein the step of locating electrodes comprises the deposition of an electrically conducting layer over substantially all surfaces of said grooves.

11. The method of claim 1, wherein the base wall comprises an electrically insulating substrate and a surface layer of piezo-electric material and wherein the step of forming grooves comprises extending at least certain of said grooves a substantial distance into said substrate.

12. The method of claim 11, wherein alternate grooves are extended into said substrate.

* * * * *